(12) United States Patent
Meier et al.

(10) Patent No.: US 7,148,428 B2
(45) Date of Patent: Dec. 12, 2006

(54) FLEXIBLE CABLE FOR HIGH-SPEED INTERCONNECT

(75) Inventors: Pascal C. H. Meier, Sunnyvale, CA (US); Sanjay Dabral, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/950,827

(22) Filed: Sep. 27, 2004

(65) Prior Publication Data

US 2006/0067066 A1    Mar. 30, 2006

(51) Int. Cl.
*H05K 1/16* (2006.01)

(52) U.S. Cl. .................. 174/260; 361/785; 361/789; 29/825

(58) Field of Classification Search ............... 174/260, 174/261; 361/785, 790, 788, 789, 791–794
See application file for complete search history.

(56) References Cited

U.S. PATENT DOCUMENTS

| | | | | |
|---|---|---|---|---|
| 5,767,623 A | * | 6/1998 | Friedman et al. ........... | 313/509 |
| 5,920,463 A | * | 7/1999 | Thomas et al. ............. | 361/760 |
| 6,235,995 B1 | * | 5/2001 | Cheng et al. ............... | 174/254 |
| 6,324,071 B1 | * | 11/2001 | Weber et al. ............... | 361/785 |
| 6,347,946 B1 | | 2/2002 | Trobough et al. | |
| 6,721,189 B1 | * | 4/2004 | Haba .......................... | 361/792 |
| 6,771,515 B1 | * | 8/2004 | McCall et al. .............. | 361/788 |
| 6,803,649 B1 | | 10/2004 | He et al. | |
| 6,969,270 B1 | | 11/2005 | Renfro et al. | |
| 2004/0094328 A1 | * | 5/2004 | Fjelstad et al. ............. | 174/251 |
| 2004/0106306 A1 | * | 6/2004 | Miyamura et al. ........... | 439/67 |

\* cited by examiner

*Primary Examiner*—Kamand Cuneo
*Assistant Examiner*—Yuriy Semenenko
(74) *Attorney, Agent, or Firm*—Carrie A. Boone, P.C.

(57) ABSTRACT

A system and method are disclosed in which flex cables are affixed to PCBs, for providing high-speed signaling paths between ICs disposed upon the PCBs. The flex cables are fixably attached to the PCBs so as to substantially mimic their structural orientation. Where the configuration includes more than one PCB, the flex cables include multiple portions which are temporarily separable from one another and from the die, using flex-to-flex and flex-to-package connectors, allowing field maintenance of the configuration. By routing the high-speed signals between ICs onto the flex cable, single-layer PCBs can be used for non-critical and power delivery signals, at substantial cost savings. By disposing the flex cables onto the PCB rather than allowing the cables to float freely, the configuration is thermally managed as if the signals were on the PCB and cable routing problems are avoided.

26 Claims, 7 Drawing Sheets

FLEXIBLE CABLE FOR HIGH-SPEED INTERCONNECT

FIELD OF THE INVENTION

This invention relates to interconnection issues between printed circuit boards and, more particularly, to the successful transmission of high-speed signals between integrated circuits disposed on two or more printed circuit boards.

BACKGROUND OF THE INVENTION

The standard for integrating chip-to-chip communication is the printed circuit board. Printed circuit boards (PCBs) are used to interconnect and assemble electronic circuits. A typical PCB includes at least a resin-based material, a reinforcement material, and a conductive foil. By etching traces between integrated circuits (ICs) disposed upon them, PCBs provide electrical conductor paths between the ICs. PCBs also provide mechanical structure for the components that make up the system.

By far the most common PCB material is a fiber-reinforced glass epoxy material, known in the industry as Fire Retardant-4, or FR4. Woven fiberglass, impregnated with an epoxy resin, provides a solid, yet adaptable, material upon which the ICs can be disposed. The traces etched upon or within the PCB, typically copper, are intended to provide the sole signal path between circuits. Electrical signals, however, do not always follow the intended path.

One of the measured characteristics of the PCB is its dielectric constant. The dielectric constant of a material relates to the velocity at which signals travel within the material. The speed of a signal propagating along a trace is inversely proportional to the square root of the dielectric constant of the PCB upon which the trace is formed. Thus, the dielectric constant of the PCB affects the speed of all signals propagating on the PCB. The dielectric constant is actually variable, and may change with a modification in frequency, temperature, humidity, and other environmental conditions. Further, because the PCB is heterogeneous, comprising woven strands of fiberglass embedded in an epoxy resin, the dielectric constant at any point on the PCB is likely to vary. Thus, while the signal may follow the path of the trace, there may be some loss due to the changing dielectric constant of the underlying PCB. For very high-speed signals, the loss may be unmanageable.

Another characteristic relevant to signal transmission is the dissipation factor of the PCB. Dissipation factor is a measure of the electrical losses in a material. Materials may have similar dielectric constants, yet have very different dissipation factors. Particularly where high-speed signals are transmitted, the dissipation factor of the material, as well as its dielectric constant, are considered during system design.

Processor-based systems, such as personal computers, server systems, and the like, often include multiple PCBs connected together. A motherboard PCB may have connectors for receiving one or more daughtercards, for example. As the signal passes between the motherboard and the daughtercard, loss may occur because the two boards are not impedance-matched with each other, or because the connector is not impedance-matched with either the motherboard or the daughtercard. Impedance matching becomes more difficult as the signal speed increases.

Current high-speed interconnect technologies require a substantial amount of wiring between chips. For example, a single PCI Express connection has 16 lanes (two differential signal pairs traveling in opposite directions), requiring 64 wires between chips. (The PCI Express bus is a high-performance bus for connecting processors, add-in cards, controllers, and the like. The PCI Express Specification is available from The PCI Special Interest Group, Portland, Oreg. 97124.) To support this and other high-performance buses, PCBs may include many layers, employ increasingly sophisticated shielding techniques, and so on.

Additionally, signal speeds of up to 6.25 GigaTransfers/second (GT/s) are being achieved in many processor-based systems, with speeds exceeding 10 GT/s expected in the near future. Current FR4-based PCB materials are characterized by severe dielectric loss at these speeds. Other materials have been considered, to replace current PCB designs, but are prohibitively expensive.

Thus, there is a continuing need to provide an alternative to the current PCB model for providing high-speed interconnections between circuits.

DETAILED DESCRIPTION

In accordance with the embodiments described herein, a system and method are disclosed in which flex cables are affixed to PCBs, for providing high-speed signaling paths between ICs disposed upon the PCBs. The flex cables are fixably attached to the PCBs so as to substantially mimic their structural orientation. Where the configuration includes more than one PCB, the flex cables include multiple portions which are temporarily separable from one another and from the die, using flex-to-flex and flex-to-package connectors, allowing field maintenance of the configuration. By routing the high-speed signals between ICs onto the flex cable, single-layer PCBs can be used for non-critical and power delivery signals, at substantial cost savings. By disposing the flex cables onto the PCB rather than allowing the cables to float freely, the configuration allows thermal air to flow as if the signals were on the PCB and cable routing problems are avoided.

In the following detailed description, reference is made to the accompanying drawings, which show by way of illustration specific embodiments in which the invention may be practiced. However, it is to be understood that other embodiments will become apparent to those of ordinary skill in the art upon reading this disclosure. The following detailed description is, therefore, not to be construed in a limiting sense, as the scope of the present invention is defined by the claims.

Figure 1A:
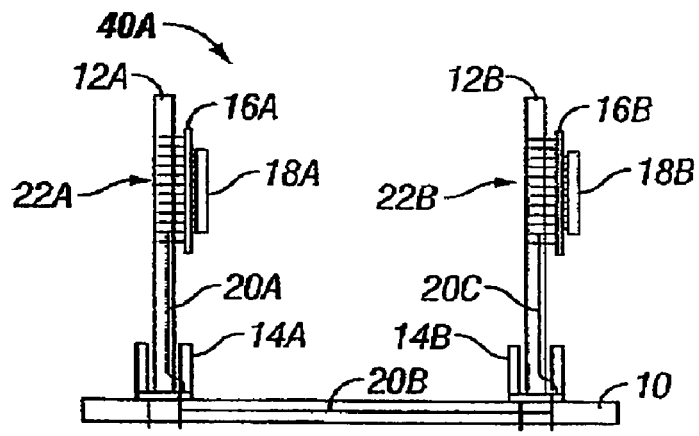
FIGS. 1A–1C are side views of PCB configurations featuring a motherboard and two daughtercards, according to the prior art.

In FIG. 1A, a typical PCB configuration 40A, including a motherboard 10 and two daughtercards 12A and 12B (collectively, daughtercards 12), is depicted, according to the prior art. The daughtercard 12A is coupled to the motherboard 10 using connector 14A. Similarly, the daughtercard 12B is coupled to the motherboard 10 using connector 14B (collectively, connectors 14). Both the motherboard 10 and the daughtercards 12 are printed circuit board (PCB) materials, which enable integrated circuits (ICs) to communicate via signal traces which are etched upon or within the PCB and between the ICs.

The daughtercard 12A features a substrate 16A, upon which is disposed a die 18A, to form a package 22A. Similarly, daughtercard 12B features a substrate 16B and a die 18B, forming a package 22B (collectively, substrate 16, die 18, and package 22). The die 18 is also commonly called a "chip" or an integrated circuit; the die includes the transistors and other elements that form the logic of the device. Die sizes are typically 1 cm by 1 cm, but may vary considerably, usually depending on the density of the embedded logic. The substrate 16 is itself a small, dedicated PCB, which connects the die to the PCB, whether to the motherboard or to a daughtercard. Because the outputs from the die are spaced very closely together, the substrate spreads the outputs out, for successful interconnection to the PCB. A typical substrate may be 3 cm by 3 cm, but, as with die, the size of the substrate may vary. Likewise, the size of a package may vary considerably.

Signals may be routed between the dies 18 and other ICs (not shown). For communication between the die 18A and the die 18B, a trace connection 20, including trace connections 20A, 20B, and 20C, as shown in FIG. 1A, form the signaling paths. Trace connection 20A is etched on the daughtercard 12A; trace connection 20B is etched on the motherboard 10; and trace connection 20C is etched on the daughtercard 12B.

The connectors 14 are carefully designed to ensure impedance matching between the signal paths. Although impedance matching between any two distinct elements is usually possible in well-designed systems, a tolerance of between five and ten percent can be expected. Preferably, there is no signal degradation as the signal passes from the daughtercards to the motherboard, and vice-versa. Similarly, the substrates 16A and 16B are designed to lessen any loss in signal integrity as the signal travels from the trace connection 20A to the die 18A, and vice-versa, as well as between the trace connection 20C and the die 18B.

Successful communication between the die 18A and the die 18B depends on the signal traveling, with minimal loss, from the die 18A through the substrate 16A, along the trace 20A, through the connector 14A, along the trace 20B, through the connector 14B, along the trace 20C, through the substrate 16B, and to the die 18B. It is expected that the dielectric constant will vary along the signal path in the PCB configuration 40A of FIG. 1A.

Figure 1B:
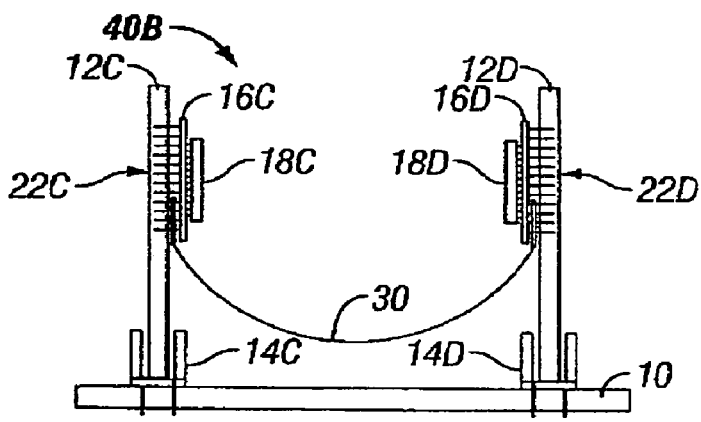

An alternative approach for communication between dies is depicted in FIG. 1B, featuring a PCB configuration 40B which uses a flex cable 30, according to the prior art. The PCB configuration 40B features the motherboard 10, this time with daughtercards 12C and 12D. The daughtercard 12C includes a substrate 16C and a die 18C, forming a package 22C, while the daughtercard 12D includes a substrate 16D and a die 18D, forming a package 22D. Instead of routing signals along trace connections, signals pass from the die 18C to the die 18D through the flex cable 30.

In FIG. 1A, the daughtercards 12A and 12B are similarly oriented, with packages 22A and 22B located on the right side of the card. In contrast, the daughtercard 12D of FIG. 1B is oriented such that the package 22D is located on the left side of the card. In other words, the substrate 16C and the die 18C (package 22C) face the substrate 16D and the die 18D (package 22D). This enables the flex cable 30 to be easily connected between the two die.

The flex cable provides an alternative to the PCB for transmitting signals between elements. Flex cables have been used in processor-based systems for a very long time. The first personal computers featured a hard disk drive coupled to the motherboard using a flexible ribbon cable. More recently, system such as laptop computers or cell phones, in which space is limited, may successfully employ flex cables, such as to couple the display panel to the motherboard. System designers may be motivated to use flex cables in applications where space is limited, right-angle connections are needed, significant shock and vibration issues exist, connectors need to be easily replaced, and lower cost is desired, to name a few.

Flex cables are available in a myriad of sizes and shapes and are used in many different applications. At the very least, the flex cable features an insulation material and a conductor material. Flex cables are sought based on pin densities, pitch, insulator and conductor properties, flex capability, wire size, orientation, and so on. Very often, the flex cable is custom-designed to fulfill a particular system design. The insulation material of the flex cable may include polyolefin, polyvinyl chloride (PVC), thermoplastic elastomer (TPE), fluorinated ethylene propylene (FEP), polytetrafluoroethylene (PTFE), polyimide, and liquid crystal polymer, to name but a few choices. The conductor material of the flex cable may include copper, copper alloys, tungsten, gold, stainless steel, platinum, platinum/iridium, and more. The flex cable described herein may include, but are not limited to, any of the varieties of flex cables known in the industry.

In the configuration 40B of FIG. 1B, the flex cable 30 provides a shorter signaling path between the packages 22C and 22D than does the trace routing of FIG. 1A. Further, the flex cable 30 reduces the dielectric loss that characterizes PCB trace connections, particularly at high speeds. The connectors 14A and 14B have been replaced with connectors 14C and 14D. Since high-speed signals are routed through the flex cable 30, and not through the connectors 14C and 14D, the impedance matching characteristics of the connectors are of less significance than in the configuration 40A (FIG. 1A), and may thus feature a higher tolerance than with the connectors 14A and 14B. This higher tolerance ensures that low-speed and/or power delivery signals are transmitted with minimal loss. The connectors 14C and 14D continue to provide mechanical support between the motherboard 10 and the daughtercards 12C and 12D. Because of the higher tolerance characteristics, the connectors 14C and 14D are likely to be less expensive than the connectors 14A and 14B.

While the flex cabling 30 thus provides some benefit for effectively routing high-speed signals between the die, several new issues exist. Field maintenance of the PCB configuration 40B may be problematic. In FIG. 1B, one side of the flex cable 30 is disposed beneath the substrate 16C, for connection to the die 18C. Since the substrate 16C is permanently affixed to the daughtercard 12C, replacement of the flex cable 30 in the field may be difficult or impossible. Further, the routing of the flex cable 30 during field maintenance may change, which may invalidate or compromise previously conducted testing of the configuration, such as electromagnetic interference (EMI) and other test data. For example, the cable may be twisted before being reattached to the die. Also, the "floating cable" configuration shown in FIG. 1B may actually block the thermal path of airflow through a system including the configuration 40B. Processor-based systems, such as personal computers, typically include strategically placed heatsinks and fans, to prevent the processor or other ICS from overheating. Further, the mechanical layout of components within such systems is carefully considered so as to ensure manufacturability, reliability, accessibility, and other criteria for enhancing the value of the product.

Figure 1C:
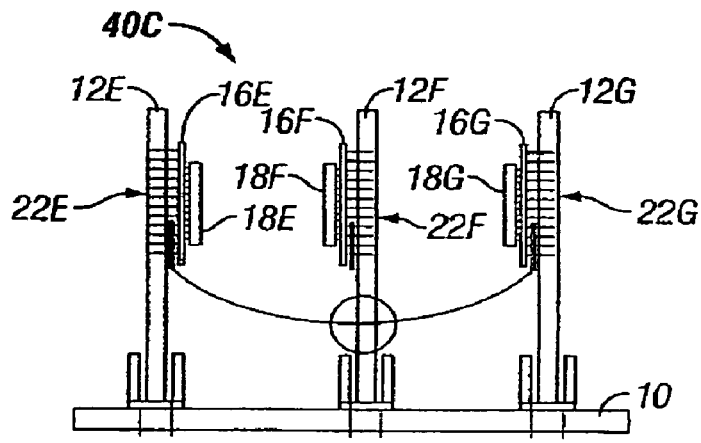

The configuration 40B of FIG. 1B is not possible where three or more daughtercards are present, as depicted in the configuration 40C of FIG. 1C. The position of the daughtercard 12D in FIG. 1B is reversed so that dies 18C and 18D face one another, simplifying the use of the flex cabling 30 between the dies. In FIG. 1C, daughtercards 12E, 12F, and 12G are present, including substrates 16E, 16F, and 16G and dies 18E, 18F, and 18G, forming packages 22E, 22F, and 22G, respectively. Where signal connections between the three die are needed, attaching flex cables between them is not readily achieved. This issue is particularly problematic for server chasses, in which configurations with multiple daughtercards are common.

Figure 2:
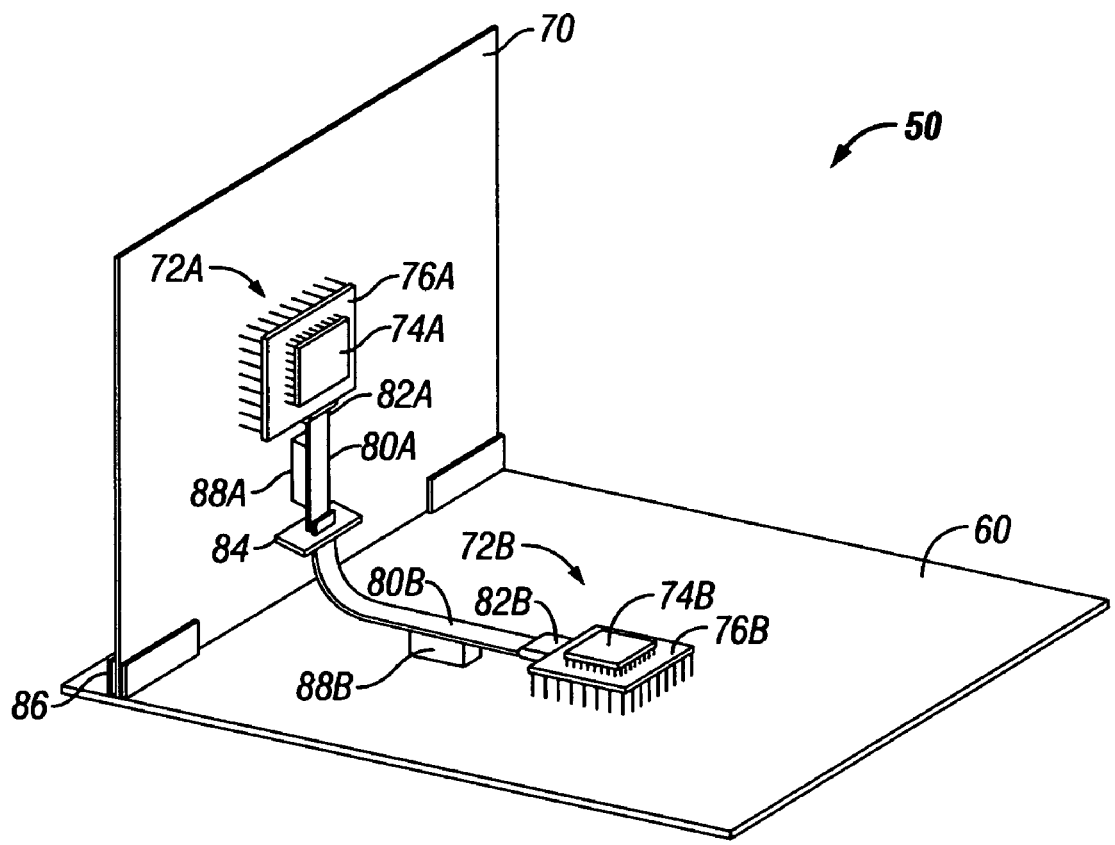
FIG. 2 is a perspective view of a configuration featuring flex cables for non-permanent connection between a motherboard and a daughtercard, according to some embodiments.

In FIG. 2, a flex-cable-on-PCB configuration 50 is depicted to address the above problems, according to some embodiments. The flex-cable-on-PCB configuration 50 includes a motherboard 60 and a daughtercard 70, both of which are standard PCBs. A package 72A, including a die 74A and a substrate 76A, are disposed on the daughtercard 70 while a package 72B, including a die 74B and a substrate 76B, are disposed on the motherboard 60. The daughtercard 70 is connected to the motherboard 60 using an anchor 86. The anchor 86 provides structural support between the daughtercard and the motherboard, as well as allowing electrical connection for low-speed or non-critical signals, such as those used to deliver power. The anchor 86 does not, however, provide a signaling path for high-speed signals. Instead, a flex cable provides a high-speed signaling path between the die 74A and the die 74B. The anchor 86 may thus be designed with a higher tolerance than those for connectors 14A and 14B (FIG. 1A) through which high-speed signals are transmitted.

The flex cable is divided into two components: flex cable 80A, attached to the daughtercard 70, and flex cable 80B, attached to the motherboard 60 (collectively, flex cables 80). Like many prior art cables, the flex cables 80A and 80B have a flattened surface that is similar to a ribbon, in contrast to cylindrically shaped cables, such as coaxial cables. Such flattened cables are sometimes referred to as "ribbon cables." In some embodiments, the flex cables are permanently affixed to the motherboard and daughtercards, such as by using adhesive or solder bond. Adhesives 88A and 88B are depicted in FIG. 2. Adhesive 88A affixes flex cable 80A to the daughtercard 70 while adhesive 88B affixes flex cable 80B to the motherboard 60. When adhered to the motherboard 60 or daughtercard 70, the flattened surfaces of the flex cables 82A and 82B are disposed equidistant at all points from the surface of the respective PCBs, as well as being substantially parallel to the respective PCBs. As another alternative, the flex cables may be tied down to the PCB. By affixing the flex cables to the PCBs, the flex cables do not "float." In addition to preventing the cables from blocking the thermal path of the flex-cable-on-PCB configuration 50, the flex cables 80 essentially mimic the mechanical arrangement or orientation of the PCBs, i.e., the motherboard 60 and the daughtercard 70.

Connection between the dies 74A and 74B is achieved using flex-to-flex connector 84 and flex-to-package connectors 82A and 82B (collectively, flex-to-package connectors 82). Flex-to-package connector 82A joins the package 72A to the flex cable 80A; flex-to-flex connector 84 joins the flex cable 80A to the flex cable 80B; flex-to-package connector 82B joins the flex cable 80B to the package 72B. The flex-to-package connectors 82, the flex cables 80A and 80B, and the flex-to-flex connector 84 thus form a contiguous path for transmitting high-speed signals between the dies 74A and 74B. Accordingly, the flex-to-flex connector 84 and the flex-to-package connectors 82 are impedance-matched with the packages 72A and 72B and with the flex cables 80A and 80B, to maintain signal integrity along the entire path.

The flex-to-package connectors 82 may employ one of many possible implementations for forming a connection between the flex cable and the die. In some embodiments, the flex-to-package connector 82A is actually part of the flex cable 80A, specially made for coupling to a package. By forming the flex-to-package connector as part of the flex cable, discontinuities in the signaling path may be lessened. Establishing the connection to the package may likewise be implemented in several ways.

In some embodiments, the package 72A is connected to the flex cable 80A using controlled collapsible chip connect ($C^4$) technology, a method with many well-known variations in the industry for making such connections. $C^4$ is a technology for connecting the die to the substrate, but it can also be used to connect the package to the PCB or to the flex cable. In the flex-cable-on-PCB configuration 50 of FIG. 2, the substrate 76A includes socket elements connected to the daughtercard 70 and shorter socket elements connected to the flex cable 80A. Some of these socket elements may be connected to the flex cable 80A using $C^4$ connections.

Figure 3:
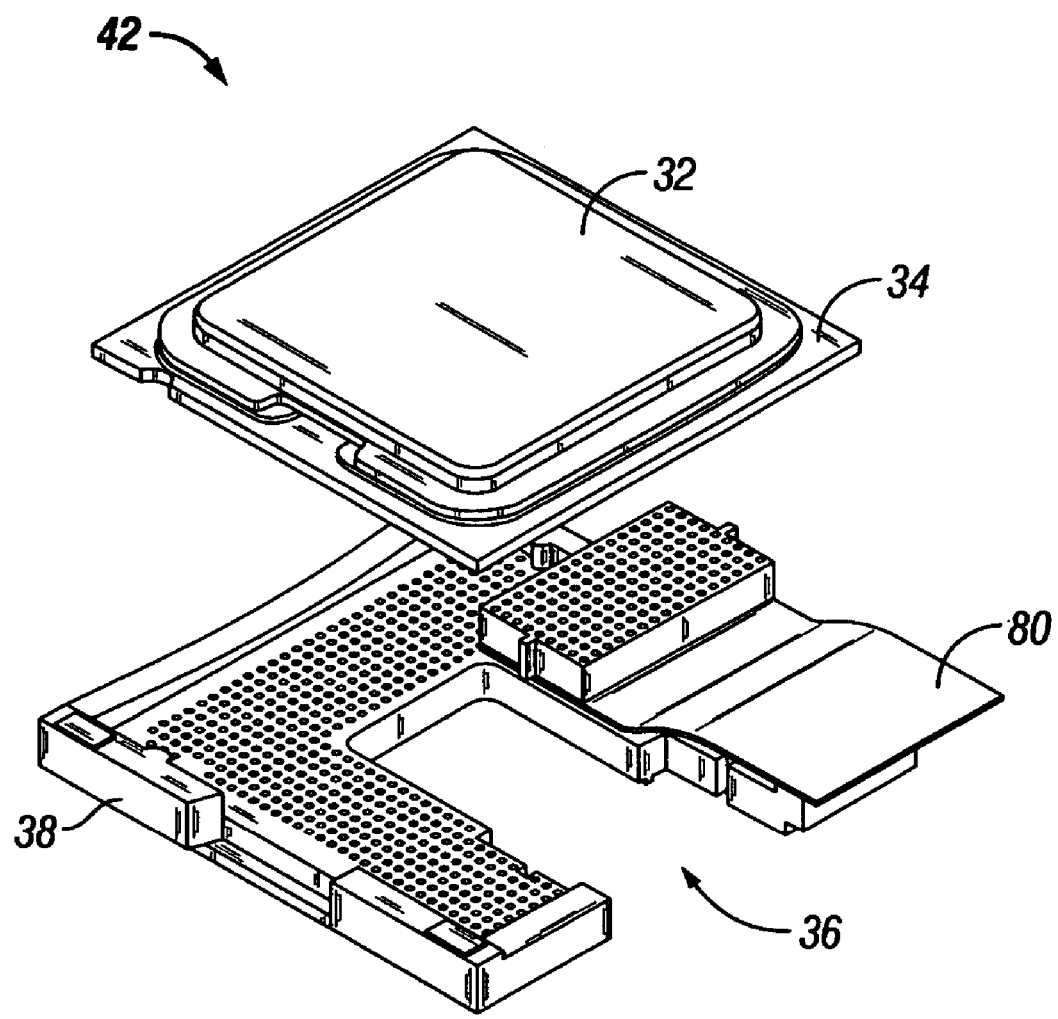
FIG. 3 is a perspective view of a package including a high-speed portion of a two-part socket element, according to some embodiments.

In other embodiments, the package 72A may include a specialized two-part socket element, both of which are coupled to the die. As depicted in FIG. 3, a package 42 is depicted, in which a die 32 and a substrate 34 are disposed upon a two-part socket element. The socket element includes a main socket element 38, which is soldered or otherwise affixed to the PCB, and a high-speed socket element 36, connected to the main socket element, which is affixed to a high-speed, low-loss substrate, such as the flex cable 80. In the configuration 50 of FIG. 2, the flex-to-package connector 82A may be the high-speed socket element 36.

In still other embodiments, the die connects to the flex cable by way of the package and the PCB. The die is connected to the package and the package to the PCB using well understood techniques, of which there are many. The flex cable is then connected to the PCB such that a signaling path to the die is made. Again, there are many ways in which the flex cable can be coupled to the PCB at the high-speed signaling path. Because there are many discontinuities in the signaling path, the flex-to-PCB solution may not be preferred in an initial design. However, where the high-speed signaling path on the PCB is destroyed, it may be replaced with the flex cable with relative ease. Thus, an otherwise scrapped system may be recovered the flex-to-PCB solution. Although the flex-to-package connectors 82 may permanently or semi-permanently affix the flex cable to the package, they may be disengaged and reengaged, such as during field maintenance.

In FIG. 2, the flex-to-package connector 82A appears to be disposed beneath the substrate 76A of the package 72A.

Figure 4A:
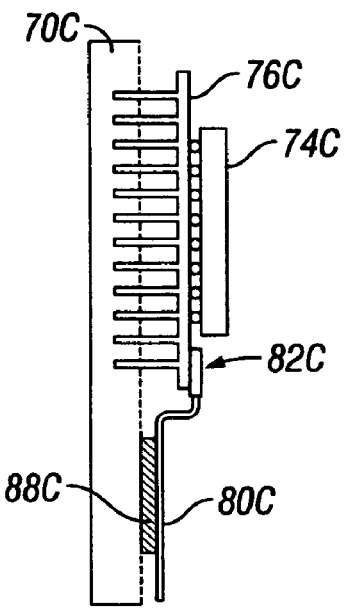
FIGS. 4A–4C are side views of alternative methods for connecting the flex cable to the package on the PCB, according to some embodiments.
Figure 4B:
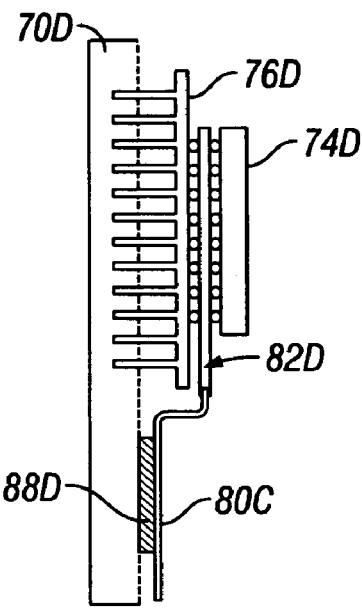
Figure 4C:
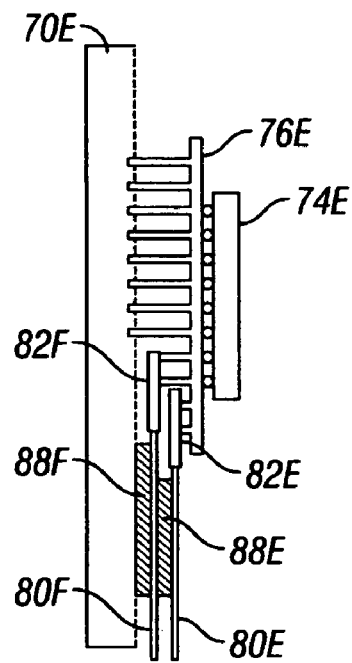

This is one way in which connection between the flex cable 80A and the die 74A can be achieved. Three other possibilities for coupling the flex cable to the package are depicted in FIGS. 4A–4C, according to some embodiments. In FIG. 4A, a die 74C and substrate 76C are disposed on a PCB 70C, which may be a motherboard or a daughtercard. Flex cable 80C is affixed to the PCB 70C using adhesive 88C. A flex-to-package connector 82C is disposed on the top (die side) of the substrate 76C. Advantageously, the flex-to-package connector 82C is closer to the die 74C and thus there is less of the substrate 76C to traverse before the signal transmits to the flex cable 80C. The implementation of FIG. 4A can be achieved using a number of methods familiar to one of ordinary skill in the art.

In FIG. 4B, a die 74D and substrate 76D are disposed on a PCB 70D. Instead of using a flex-to-package connector, as in prior examples, the configuration of FIG. 4B uses a flex-to-die connector 82D, disposed between the die 74D and the substrate 76D. The flex-to-die connector 82D traverses the entire length of the die and substrate. By disposing the flex-to-die connector 82D directly beneath the die, a shorter signal path may result. Connections between the flex-to-die connector 82D and the substrate 76D may also be made for low-speed signals, as needed.

In FIG. 4C, a die 74E and substrate 76E, disposed on a PCB 70E, are coupled with two flex cables 80E and 80F by flex-to-package connectors 82E and 82F, respectively. The flex-to-package connector 82E is disposed beneath the substrate 76E and coupled to one set of pins while the flex-to-package connector 82F, also disposed beneath the substrate (and beneath the flex-to-package connector 82E), is coupled to a second set of substrate pins. Thus, a number of flex cable connections can be made to a single substrate, such as when there is a need for more cable links to the substrate. Where the package includes a high I/O pin count, the addition of multiple flex cable arrangements is not difficult to achieve.

Returning to FIG. 2, the flex-to-flex connector 84, which connects flex cable 80A to flex cable 80B, may likewise be implemented in a number of ways. The flex-to-flex connector 84 may be disengaged in order to separate the two flex cables. The disengagement may involve unlatching, unhooking, unsnapping, or other action for disconnecting the two flex cables. Where one or more daughtercards are present, as in the flex-cable-on-PCB configuration 50 of FIG. 2 (as well as the configurations depicted in FIGS. 5 and 6, below), the non-permanent nature of the flex-to-flex connector 84 enables the daughtercard to be temporarily removed from the motherboard 60, such as during field maintenance. Nevertheless, the quality of the signaling path is maintained using the flex-to-flex connectors. Thus, the flex-to-flex connectors 84 provide a mechanism by which the flex cables are not permanently coupled together (so that the daughtercards can be removed), yet a quality signaling path for the high-speed signal is maintained, in some embodiments.

The flex-to-flex connectors may be produced in a number of ways that are well-known in the industry. As one example, the two flex cables can be aligned along exposed electrical connections, which may be bumps or pads on the cable, then clamped together so that a tight coupling of the electrical connections for each cable is made. The flex-to-flex connector may also include an elastomer, such as rubber, to ensure a secure connection between cables and to prevent damage during engagement. The clamp of the flex-to-flex connector may include a locking mechanism, which is disengaged when separating the flex cables, then re-engaged once the field maintenance of the system is complete.

Preferably, the flex-to-flex connector 122 includes "guides" for properly seating and aligning the flex cables before clamping them together. The guides may be made from thermoplastic or other insulating material. Other implementations for the flex-to-flex connectors are also possible.

The flex-to-flex connector 84 and the anchor 86 may be easily engaged or disengaged. Thus, daughtercards can easily be attached to or removed from the motherboard in the field, despite the presence of the attached flex cables. To remove the daughtercard 70 from the motherboard 60, the flex-to-flex connector 84 is first disengaged, separating the flex cable 80A from the flex cable 80B. Next, the daughtercard 70 is removed from the anchor 86. To restore the original configuration, the process is reversed: the daughtercard 70 is seated in the anchor 86, the flex cables are oriented such that their electrical paths are aligned, and the flex-to-flex connector 84 tightly fastens the flex cables together. Field maintenance of the flex-cable-on-PCB configuration 50 is thus straightforward.

Figure 5:
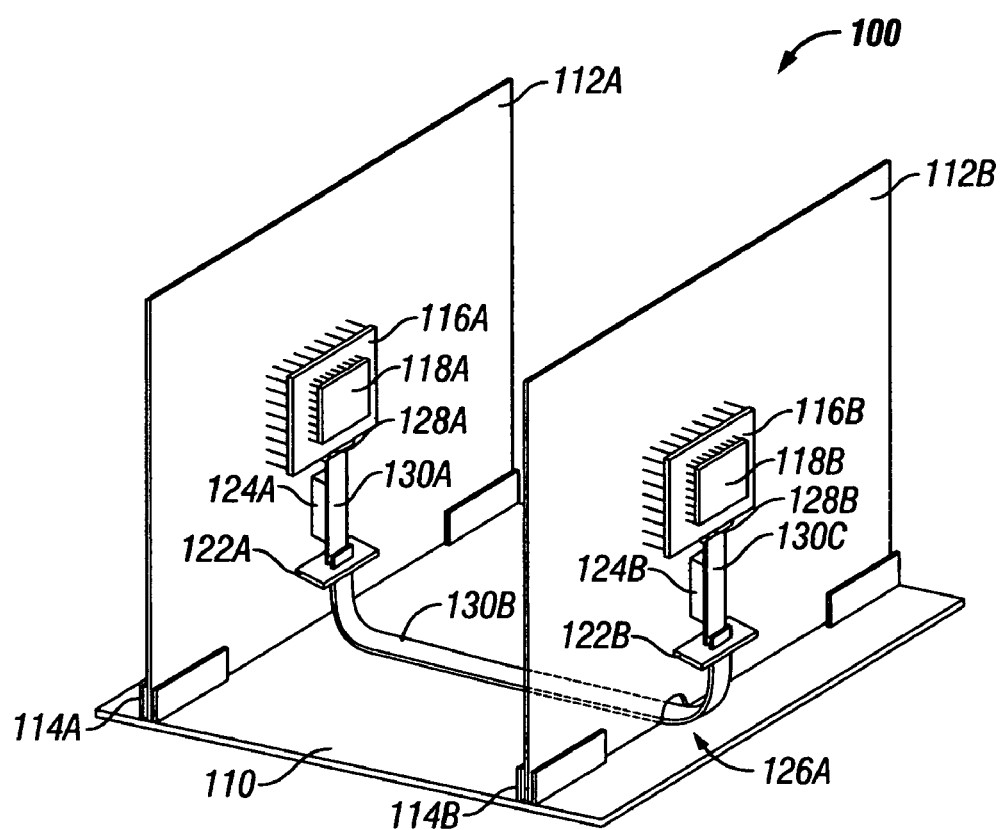
FIG. 5 is a perspective view of a configuration featuring flex cables for non-permanent connection between a motherboard and two daughtercards, according to some embodiments.

For many processor-based systems, such as servers, a configuration involving multiple daughtercards is common. The flex-cable-on-PCB method can work where relatively complex arrangements of PCBs exist, with slight adjustment from the configuration 50 depicted in FIG. 2. In FIG. 5, for example, a flex-cable-on-PCB configuration 100 includes a motherboard 110 and two daughtercards 112A and 112B (collectively, daughtercards 112). A substrate 116A and a die 118A (package 132A) are disposed on the daughtercard 112A while a substrate 116B and a die 118B (package 132B) are disposed on the daughtercard 112B.

The daughtercards 112A and 112B are connected to the motherboard 110 using anchors 114A and 114B, respectively (collectively, anchors 114). As in the configuration 50, the anchors 114A and 114B provide structural support between the daughtercards and the motherboard, as well as allowing electrical connection for low-speed or non-critical signals, such as those used to deliver power. A flex cable provides a high-speed signaling path between the die 118A and the die 118B. The anchors 114 may thus be designed with a higher tolerance than those for connectors through which high-speed signals are transmitted.

The flex cable is divided into three components: flex cable 130A, attached to the daughtercard 112A, flex cable 130B, attached to the motherboard 110, and flex cable 130C, attached to the daughtercard 112B (collectively, flex cables 130). In some embodiments, the flex cables are permanently affixed to the motherboard and daughtercards, such as by using adhesive, solder bond, or a tie-down mechanism. Adhesive 124A affixes flex cable 130A to daughtercard 112A, adhesive 124B affixes flex cable 130B to motherboard 110, and adhesive 124C affixes flex cable 130C to daughtercard 112B. Thus, the flex cables do not "float" but assume a known position, essentially mimicking the orientation of the PCBs.

Connection between the dies 118A and 118B is achieved using flex-to-flex connectors 122A and 122B (collectively, flex-to-flex connectors 122) and flex-to-package connectors 128A and 128B (collectively, flex-to-package connectors 128). Flex-to-package connector 128A joins the package 132A to the flex cable 130A; flex-to-flex connector 122A joins the flex cable 130A to the flex cable 130B; flex-to-flex connector 122B joins the flex cable 130B to the flex cable 130C; flex-to-package connector 128B joins the flex cable 130C to the package 132B. Both the flex-to-flex connectors 122 and the flex-to-package connectors 128 are impedance-matched with the packages 132 and with the flex cables 130, to minimize loss of electrical energy along the signaling path. As with the connectors of FIG. 2, the flex-to-package connectors and the flex-to-flex connectors may be made in a variety of ways known to the industry.

The flex-to-flex connectors 122 and the anchors 114 may be easily engaged or disengaged. Daughtercards can easily be attached to or removed from the motherboard in the field, despite the presence of the attached flex cables. Field maintenance of the flex-cable-on-PCB configuration 100 is thus straightforward.

In the flex-cable-on-PCB configuration 100, the orientation of the two daughtercards is the same as in FIG. 1A, such that the substrate and the die are disposed on the same side of each board. To connect the flex cable 130B to the flex cable 130C, the daughtercard 112B includes a hole 126A, through which the flex cable 130B is threaded. By threading the flex cable through the hole 126, reorientation of the daughtercard is not necessary.

The characteristics featured in the flex-cable-on-PCB configuration 100 of FIG. 5 can be emulated in other systems, such as those configurations which include more than two daughtercards. In another flex-cable-on-PCB configuration 200, shown in FIG. 6, for example, a motherboard 210 supports daughtercards 212A, 212B, and 212C. Flex cables 230A, 230B, and 230C (collectively, flex cables 230) establish a signaling path between a die 218A (on the daughtercard 212A) and a die 218B (on the daughtercard 212B) while flex cables 240A, 240B, and 240C (collectively, flex cables 240) establish a signaling path between the die 218A and a die 218C (on the daughtercard 212C). As the perspective view of FIG. 6 shows, two separate and distinct signaling paths are established using flex cables 230 and 240.

Since the die on each daughtercard in the flex-cable-on-PCB configuration 200 are similarly oriented, daughtercards 212B and 212C include holes 226A and 226B, respectively, through which the flex cables 230 and 240 are threaded. This arrangement allows the flex-to-package connectors 228A, 228B, and 228C and the flex-to-flex connectors 222A, 222B, and 222C to be similarly arranged and oriented on their respective daughtercards. Such similarity is not mandatory, e.g., the flex-to-package connector 228A may be a $C^4$-type connector, while the flex-to-package connector 228B may be a two-part socket element including a high-speed portion, such as the socket element depicted in FIG. 3. Likewise— the flex-to-flex connectors 222A, 222B, and 222C do not have to be identical in type. Preferably, though, the flex-to-package and flex-to-flex connectors are disposed at the same location on each daughtercard and are similarly engaged and disengaged, as a homogeneous arrangement simplifies manufacturing and field maintenance of the flex-cable-on-PCB configuration 200.

Figure 6:
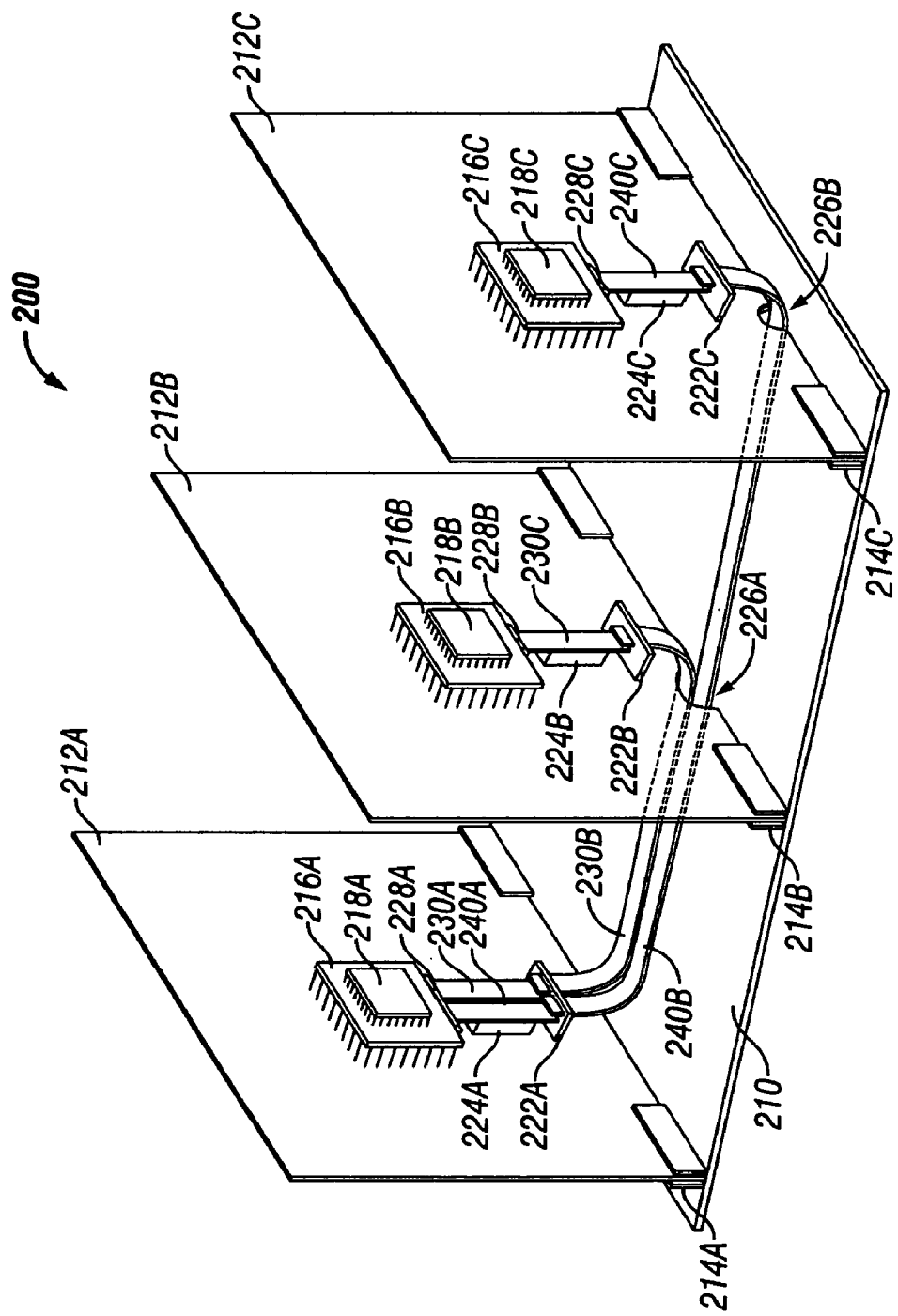
FIG. 6 is a perspective view of a configuration featuring flex cables for non-permanent connection between a motherboard and three daughtercards, according to some embodiments.

Additional flex-cable-on-PCB configurations are possible besides those depicted in FIG. 6. For example, server systems in which several daughtercards are present may be arranged to employ flex-cable-on-PCB. The daughtercards may be orientated to optimize routing of the cable. Placement of the through holes in the PCBs, such as the holes 226A and 226B, method of attaching the flex cable to the package (see FIGS. 2, 3, 4A, 4B, and 4C, above), the pin count of the substrate, and other characteristics may also be considered when routing boards and flex cable. As with PCBs themselves, the possibilities for flex-cable-on-PCB configurations are virtually unlimited.

The physical dimensions of the wires routed in PCBs are similar to that of flex cables. To accommodate a single CSI channel, a flex cable of 3–3.5 cm would suffice. Since PCBs may include multiple layers, a PCB implementation may divide a single CSI channel into two layers, for a width of 1.5–1.75 cm. Flex cables may also be layered upon one another. A two-layer flex cable, which includes a signal layer and a ground layer, may be very thin (e.g., less than 0.1 mm).

Stacking such flex cables poses few mechanical challenges. As with the multiple layers of a PCB, signal crosstalk between overlapping flex cables may occur. However, additional spacing between the flex cables, to effectively "bridge" one flex cable over another, may lessen crosstalk between signals. As with any PCB design, a well-devised layout of the flex cables upon the PCBs can resolve crosstalk, EMI, and other signal loss concerns. Where the design area is very limited, stacking of the flex cables may be preferred. Multi-layer flex cable packages are available where available space is constrained.

By transferring high-speed signals from the PCB to the flex cable, lower-speed, non-critical and power delivery signals remain on the PCB. In some embodiments, a multi-layer PCB can be replaced with a single-layer PCB upon which one or more flex cables are attached, as disclosed above. In some cases, substantial cost savings can be achieved using the flex-cable-on-PCB approach described herein.

The benefit of replacing PCB with the flex cable to transmit high-speed signals varies according to the quality of the flex cable. Flex cable is typically constructed using a metal and plastic lamination process, and may use different adhesive materials, depending upon the application. Flex cables used for low-speed power delivery are likely to be substantially different than those used for military designs or flame-retardant materials, for example. Methods exist to minimize the dissipation factor of the flex cable, such as using very small amounts of adhesive during the process, in order to achieve higher performance. These flex cables are sometimes known as adhesiveless flex cables in the industry, although some adhesive is used in their production, and are known herein as high-performance flex cables. The flex cables described herein are not limited to these high-performance flex cables, as other methods may achieve similar or improved results.

According to one measurement, a high-performance flex cable has an attenuation constant of less than 50% that of FR4 PCBs. Compared to a PCB channel operating at a given data rate, the same design can operate at about 1.5 times that data rate, where the same chip-to-chip distances and the same connections are used. Thus, the use of flex cable shows substantial advantages in signal transmission properties which could greatly improve chip-to-chip data rates. Table 1 shows a comparison of these two interconnect technologies.

TABLE 1

| Comparison of interconnect technologies | | |
|---|---|---|
| interconnect technology | FR4 | flex cable |
| dissipation factor | 0.02–0.03 | ~0.005 |
| data rate @ 7 inches | 1 x | 1.5 x |

Flex-cable-on-PCB thus addresses several issues for the design of systems which transmit high-speed signals chip-to-chip. The very high-speed signaling path is moved from the PCB, which, despite complex designs involving multiple layers, is no longer able to inexpensively transmit such signals. Flex cables are capable of transmitting such signals with very little loss at less expense. Because of the variety of flex cable types and vendors, available materials, and industry demand, flex cable technology is likely to be able to support high-speed signaling for some time.

Flex-cable-on-PCB does not abandon the PCB paradigm. A system including PCBs with multiple ICs is replete with design considerations such as available space, thermal management, upgradability, reliability, and so on. The PCBs are physically arranged with these considerations in mind. By affixing to the PCBs, the flex cables mimic the arrangement of the PCBs, such that the system design considerations are not ignored. The flex-cable-on-PCB scheme improves thermal management of the system and enables more predictable field maintenance.

Flex-cable-on-PCB does not replace the PCB, but may substantially simplify its design. Multiple-layered PCBs may be replaced with single-layer or less complex PCBs, with substantial cost savings for the system design.

Figure 7:
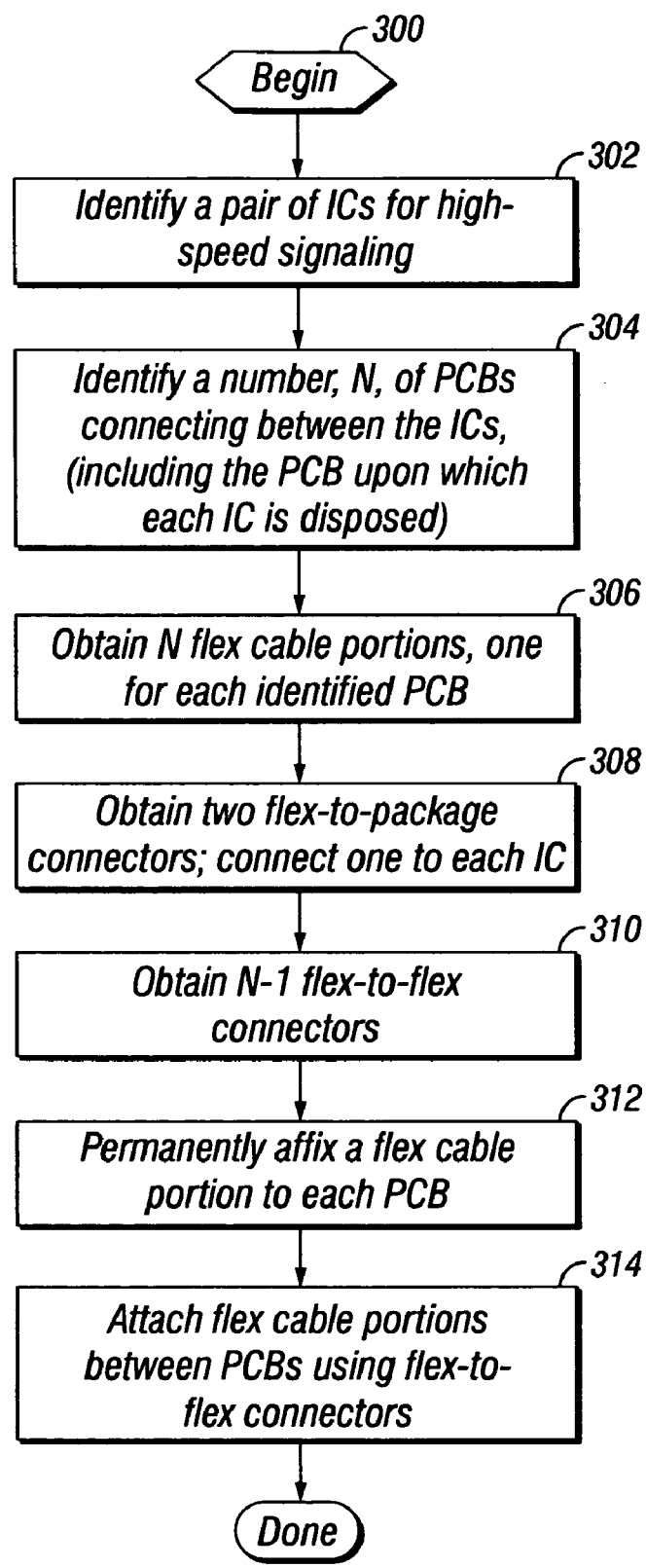
FIG. 7 is a flow diagram of the flex-cable-on-PCB method, according to some embodiments.

In FIG. 7, a flow diagram shows the flex-cable-on-PCB method 300, for a general case where high-speed signaling is desired between two ICs. First, a pair of ICs for which high-speed signaling is desired are identified (block 302). Every PCB that is found in the system between the two ICs is identified, including the PCB(s) upon which the ICs reside (block 304). The integer number, N, of PCBs, indicates how many flex cable portions are to be used (block 306).

For each IC, a flex-to-package connector is used, for connection to the flex cable (block 308). The number of flex cables to be used is one less than the number of PCBs found; thus, N-1 flex cables are obtained (block 310). Each flex cable is permanently attached to its associated PCB, one flex cable portion for each PCB (block 312). Preferably, extra length of each flex cable is available for overlap with adjacent cables. These flex cable portions are attached together using the N-1 flex-to-flex connectors (block 314). A high-speed signaling path between the ICs is thus created, in which the PCBs provide mechanical structure for the flex cables. Where a system employs multiple high-speed signaling ICs, the method 300 may be repeated for each pair of ICs within the system.

While the invention has been described with respect to a limited number of embodiments, those skilled in the art will appreciate numerous modifications and variations therefrom. It is intended that the appended claims cover all such modifications and variations as fall within the true spirit and scope of the invention.

We claim:

1. A system, comprising:
a flex cable, to transmit signals between a first integrated circuit and a second integrated circuit, the flex cable comprising a signaling path between the integrated circuits, the first integrated circuit being disposed upon a printed circuit board and the second integrated circuit being disposed upon a second printed circuit board, the printed circuit boards comprising signaling traces, wherein the signaling path is not coupled to the signaling traces, the flex cable comprising:
a first portion, having a flattened surface, the flattened surface being substantially parallel to and proximately attached to the printed circuit board;
a flex-to-package connector fixably attached to the printed circuit board, to couple the first portion to the first integrated circuit;
a second portion, coupled to the first portion by a flex-to-flex connector, the second portion having a second flattened surface, the second flattened surface being substantially parallel to and proximately attached to the second printed circuit board; and
a second flex-to-package connector to couple the second portion to the second integrated circuit; and
an anchor to couple the printed circuit board to the second printed circuit board, the anchor further transmitting second signals between the printed circuit board and the second printed circuit board, wherein the second signals are not transmitted over the signaling path.

2. The system of claim 1, wherein the flex-to-package connector comprises a controlled collapsible chip connect to couple the first portion of the flex cable to the first integrated circuit.

3. The system of claim 1, wherein the flex-to-package connector comprises a high-speed portion of a two-part socket element to couple the first portion of the flex cable to the first integrated circuit.

4. The system of claim 1, wherein the flex-to-package connector couples the first portion to a die of the first integrated circuit.

5. The system of claim 1, wherein the flex-to-package connector couples the first portion to a substrate of the first integrated circuit.

6. The system of claim 1, wherein the first portion is attached to the printed circuit board using an adhesive material.

7. The system of claim 1, wherein the first portion is attached to the printed circuit board using a solder bond.

8. The system of claim 1, wherein the first portion is tied to the printed circuit board.

9. A system to transmit a signal between integrated circuits, the system comprising:
a flex cable affixed to a printed circuit board, the flex cable comprising a signaling path to transmit the signal between the integrated circuits, the printed circuit board comprising a signaling trace, wherein the signaling path is not coupled to the signaling trace;
a flex-to-package connector, to couple the flex cable to a package located on the printed circuit board, the package comprising an integrated circuit;
a second flex cable affixed to a second printed circuit board, the second flex cable comprising a second signaling path to transmit the signal between the integrated circuits; the second printed circuit board comprising a second signaling trace, wherein the signaling path is not coupled to the second signaling trace;
a flex-to-flex connector affixed to the printed circuit board, the flex-to-flex connector to couple the flex cable to the second flex cable when closed and to release the flex cable from the second flex cable when opened; and
a second flex-to-package connector, to couple the second flex cable to a second package located on the second printed circuit board, the second package comprising a second integrated circuit;
wherein the printed circuit board is separable from the second printed circuit board by opening the flex-to-flex connector to uncouple the flex cable from the second flex cable.

10. The system of claim 9, further comprising an anchor to structurally support the second printed circuit board on the printed circuit board, wherein the anchor further provides an electrical connection for transmission of low-speed signals between the two printed circuit boards.

11. The system of claim 10, wherein the second printed circuit board includes a hole through which the second flex cable is threaded to form a connection between the flex-to-flex connector and the second flex-to-package connector.

12. The system of claim 9, wherein the flex-to-package connector comprises a controlled collapsible chip connect to couple the flex cable to the package.

13. The system of claim 9, wherein the flex-to-package connector comprises a high-speed portion of a two-part socket element to couple the flex cable to the package.

14. The system of claim 9, wherein the flex-to-package connector couples the flex cable to a die of the integrated circuit.

15. The system of claim 9, further comprising:
a third flex-to-package connector, to couple a third flex cable to the package located on the printed circuit board;
wherein the flex cable and the third flex cable transmit signals to the package.

16. A system, comprising:
first and second packages comprising integrated circuits, the first and second packages being connected to first and second printed circuit boards, respectively, wherein the first and second printed circuit boards are anchored to a motherboard; and
a flex cable to transmit signals between a first integrated circuit and a second integrated circuit, the flex cable comprising a signaling path between the integrated circuits, the first integrated circuit being disposed upon the first printed circuit board and the second integrated circuit being disposed upon the second printed circuit board, the printed circuit boards comprising signaling traces, wherein the signaling path is not coupled to the signaling traces, the flex cable comprising: first and second flex portions affixed to the first and second printed circuit boards, respectively, the first and second flex portions each having a flattened surface, wherein each flattened surface is substantially parallel to and proximately attached to the respective printed circuit board;
a third flex portion affixed to the motherboard, the third flex portion having a second flattened surface, wherein the second flattened surface is substantially parallel to and proximately attached when affixed to the motherboard; first and second flex-to-package connectors to couple the first and second flex portions to the first and second packages, respectively; and first and second flex-to-flex connectors to couple the first and second flex portions, respectively, to the third flex portion; wherein the first and second printed circuit boards are removable from the motherboard by disengaging the first and second flex-to-flex connectors.

17. The system of claim 16, wherein the first flex-to-package connector comprises a controlled collapsible chip connect to couple the first flex portion to the first package.

18. The system of claim 17, wherein the second flex-to-package connector comprises a high-speed portion of a two-part socket element to couple the second flex portion to the second package.

19. The system of claim 16, wherein the first flex-to-package connector couples the first flex portion to a die of the first package.

20. The system of claim 16, wherein the first and second printed circuit boards are single-layer boards.

21. The system of claim 16, wherein the first flex portion is affixed to the first printed circuit board using an adhesive material.

22. The system of claim 21, wherein the second flex portion is affixed to the second printed circuit board using a solder bond.

23. The system of claim 22, wherein the third flex portion is affixed to the motherboard using tie-downs.

24. A method, comprising:
identifying a pair of integrated circuits between which high-speed signaling is desired, the pair of integrated circuits including a first integrated circuit and a second integrated circuit;
identifying a first and a second printed circuit board connecting between the integrated circuit pair;
obtaining flex cable portions and permanently affixing each flex cable portion to an associated printed circuit board, the flex cable, to transmit signals between the first integrated circuit and the second integrated circuit, the flex cable comprising a signaling path between the integrated circuits, the first integrated circuit being disposed upon the printed circuit board and the second integrated circuit being disposed upon the second printed circuit board, the printed circuit boards comprising signaling traces, wherein the signaling path is not couples to the signaling traces;
connecting a first flex-to-package connector to the first integrated circuit; connecting a second flex-to-package connector to the second integrated circuit; and attaching flex cable portions between printed circuit boards using a second number of flex-to-flex connectors, wherein the second number is one less than the number.

25. The method of claim 24, further comprising:
boring a hole in one of the printed circuit boards and threading the associated flex cable through the hole.

26. The method of claim 24, further comprising:
disengaging one of the flex-to-flex connectors such that the flex cables coupled thereto are separated; and
separating the associated printed circuit boards.

* * * * *